United States Patent
Lee

(10) Patent No.: US 7,184,307 B2
(45) Date of Patent: Feb. 27, 2007

(54) FLASH MEMORY DEVICE CAPABLE OF PREVENTING PROGRAM DISTURBANCE ACCORDING TO PARTIAL PROGRAMMING

(75) Inventor: June Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 10/819,385

(22) Filed: Apr. 5, 2004

(65) Prior Publication Data

US 2004/0208059 A1    Oct. 21, 2004
US 2007/0025150 A9    Feb. 1, 2007

Related U.S. Application Data

(63) Continuation-in-part of application No. 10/222,573, filed on Aug. 15, 2002, now Pat. No. 6,731,540.

(60) Provisional application No. 60/315,536, filed on Aug. 28, 2001.

(30) Foreign Application Priority Data

Dec. 21, 2001  (KR) ............................... 2001-82417
Apr. 18, 2003  (KR) ...................... 10-2003-0024812

(51) Int. Cl.
*G11C 16/04* (2006.01)

(52) U.S. Cl. ........................ 365/185.13; 365/185.02; 365/185.11; 365/185.28

(58) Field of Classification Search ........... 365/185.02, 365/185.11, 185.17, 185.28, 185.33, 185.13
See application file for complete search history.

(56) References Cited

U.S. PATENT DOCUMENTS

| | | | |
|---|---|---|---|
| 5,677,873 A | 10/1997 | Choi et al. ............. | 365/185.17 |
| 5,815,435 A * | 9/1998 | Van Tran ............... | 365/185.03 |
| 5,991,202 A | 11/1999 | Derhacobian et al. . | 365/185.19 |
| 6,081,450 A * | 6/2000 | Nawaki .................. | 365/185.11 |
| 6,542,406 B2 * | 4/2003 | Byeon et al. .......... | 365/185.13 |
| 6,731,540 B2 * | 5/2004 | Lee et al. .............. | 365/185.17 |

* cited by examiner

*Primary Examiner*—Son L. Mai
(74) *Attorney, Agent, or Firm*—Marger Johnson & McCollom, P.C.

(57) ABSTRACT

A non-volatile semiconductor memory device disclosed herein includes arrays of memory cells arranged along rows and columns. The columns are divided into at least two column regions and each row is divided into two electrically isolated word lines that are arranged in the column regions. The memory device further includes a determining circuit for judging which column region a data loaded on a register belongs to during a program operation, and a selecting circuit for choosing one of the rows in response to the row address information and driving one or all of the word lines in the selected row with a program voltage according to the judging.

18 Claims, 8 Drawing Sheets

FLASH MEMORY DEVICE CAPABLE OF PREVENTING PROGRAM DISTURBANCE ACCORDING TO PARTIAL PROGRAMMING

CROSS REFERENCE TO RELATED APPLICATIONS

This application claims priority under 35 USC § 119 to Korean Patent Application No. 2003-24812, filed on Apr. 18, 2003, the contents of which are herein incorporated by reference in their entirety. This application is also a continuation-in-part of U.S. Ser. No. 10/222,573 filed on Aug. 15, 2002, now U.S. Pat. No. 6,731,540B2, which claimed priority from both U.S. Provisional Application No. 60/315,536 filed Aug. 28, 2001 and Korean Patent Application No. 2001-82417, filed on Dec. 21, 2001, all commonly assigned to SAMSUNG ELECTRONICS CO., LTD.

FIELD OF THE INVENTION

The present invention generally relates to semiconductor memory devices and more specifically to flash memory devices.

BACKGROUND OF THE INVENTION

There is an increasing need for a semiconductor memory device capable of electrically erasing and programming without a refresh of a stored data. In addition, there is continual pressure to increase storage capacity and integration density of the memory device. A NAND type flash memory device is one example of a nonvolatile semiconductor memory device capable of providing a high capacity and high integration density without a refresh of stored data. Data is preserved even at power-off. The flash memory device is widely employed in electronic devices having a possibility that a power supply is interrupted suddenly (e.g., a portable terminal, a portable computer, etc.)

FIG. 1 is a block diagram illustrating a conventional NAND type flash memory device. Referring to FIG. 1, the NAND type flash memory device 10 includes a memory cell array 20, a row selection circuit (marked as "X-SEL" in the drawing) 40, and a sense and latch circuit 60 (alternatively called a page buffer circuit). A memory cell array 20 includes a plurality of cell strings (or NAND strings) 21 each string connected to one of bit lines BL0–BLm. The cell string 21 in each column comprises a string selection transistor SST as a first selection transistor, a ground selection transistor GST as a second selection transistor, and a plurality of flash EEPROM cells MCn (n=0–15) connected in serial between the selection transistors SST and GST. The string selection transistor SST in each column includes a drain connected to a corresponding bit line and a gate connected to a string selection line SSL. The ground selection transistor GST includes a source connected to a common source line CSL and a gate connected to a ground selection line GSL. Flash EEPROM cells MC15–MC0 are connected in serial between the source of the string selection transistor SST and the drain of the ground selection transistor GST. The cells in each cell string include floating gate transistors and the control gates of the transistors are connected to corresponding word lines WL15–WL0, respectively.

The string selection line SSL, the word lines WL0–WL15, and the ground selection line GSL are electrically connected to a row selection circuit 40 (X-SEL). The row selection circuit 40 selects one of the word lines according to row address information, and provides word line voltages to the selected word line and the non-selected word lines as determined by each operation mode. For example, the row selection circuit 40 provides a program voltage (e.g., 15V–20V) to a selected word line in a program mode, and a pass voltage (e.g., 10V) to non-selected word lines. The row selection circuit 40 provides a ground voltage (GND) to a selected word line and a read voltage (e.g., 4.5V) to non-selected word lines in a read mode. The program voltage, the pass voltage and the read voltage are higher than a power supply voltage. The bit lines BL0–BLm disposed through the memory cell array 20 are electrically connected to the sense and latch circuit 60. The sense and latch circuit 60 senses data from the flash EEPROM cells of the word line selected through the bit lines BL0–BLm in the read mode, and provides a power supply voltage (or a program-inhibited voltage) or a ground voltage (or a program voltage) to the bit lines BL0–BLm according to data to be programmed in a program mode.

In a NAND type flash memory device, the cells not to be programmed (referred to as a program-inhibited cell, hereinafter) may be soft-programmed by a program voltage due to characteristics of the cell structure as widely known. This is called a program disturbance. The program disturbance of the program-inhibited cell can be prevented by raising a channel voltage of the cell string to which the program-inhibited cell belongs, and this is called a self-boosting scheme. The channel voltage of the cell string follows a pass voltage provided to each of the non-selected word lines. As the pass voltage increases, soft-programming of the program-inhibited cell can be further suppressed. To the contrary, if the pass voltage increases, memory cells connected to each of the non-selected word lines may be soft-programmed by a pass voltage, and this is call "a pass disturbance". Therefore, the pass voltage should be determined considering the above conditions.

Methods of restricting programming using the self-boosting scheme fully explained above are disclosed in U.S. Pat. No. 5,677,873 entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN", and in U.S. Pat. No. 5,991,202 entitled "METHOD FOR REDUCING PROGRAM DISTURBANCE DURING SELF-BOOSTING IN A NAND FLASH MEMORY", and incorporated herein by reference.

In case of the NAND type flash memory device, memory cells of one word line may be programmed at the same time. Alternatively, the memory cells in one word line are divided into some parts, and respective parts of the memory cells may be programmed individually. This is called "a partial program scheme". In the former case, the memory cells in an identical word line are less affected by the program disturbance, while the memory cells in an identical word line are much affected by the program disturbance in the latter case. Assume that, for example, only the data to be programmed in the memory region of the bit lines BL0–Bli (a part marked with diagonal hash marks in FIG. 2) is loaded on the sense and latch circuit 60, as illustrated in FIG. 2. The memory cells in the region with a loaded data and the memory cells in the region without loaded data (in which bit lines BLi+1–BLm are arranged) are all connected to an identical word line, such that the program voltage is provided to the identical word line of the memory cells regardless of positions where the data loaded. Therefore, the possibility that the program-inhibited memory cell(s) is (are) soft-programmed increases as the number of the partial program (NOP) is rising.

This method of partial programming is often used to manage data in a small unit compared to a page size when the page size is large. For example, when using a device having a 2112 (2K+64)-sized page, four-times partial programs should be ensured for a user to perform a program by a unit of 528 (512+16) bytes. 16 bytes of the 528 bytes are stored in the spare field memory region (referring to FIG. 2), and 512 bytes are stored in the main field memory region.

Accordingly, if the number of times of partial program increases, the NAND type flash memory device becomes more susceptible to program disturbance.

SUMMARY OF THE INVENTION

Embodiments of the present invention include a NAND type flash memory device capable of preventing program disturbance due to partial programming.

In some embodiments of the present invention, a NAND type flash memory device includes arrays of memory cells disposed along rows and columns. The columns are divided into at least two column regions and each of the columns is divided into at least two electrically isolated word lines each arranged in the column regions. The NAND type flash memory device also includes a register for latching data being programmed in the array, a gate circuit for transmitting programmed data to the register in response to column address information, a determining device for judging which region the data loaded on the register operation belongs to according the column address information during a programming, and a selecting device for choosing one of the rows in response to row address information and for driving one or all of word lines in the selected row to a program voltage according to a result of judging.

In this embodiment, when all of the data loaded on the register belongs to the column regions, the selecting device drives all the word lines in the selected column to the program voltage. Alternatively, when the data loaded on the register belongs to any one of the column regions, the selecting device drives one of the word lines in the selected row to a program voltage, and the word line driven with the program voltage corresponds to a column region of the loaded data.

In some embodiments, the selecting device includes a first selection circuit for driving one of the word lines in the selected row to the program voltage, wherein the word line driven with the program voltage belongs to one of the column regions and a second selecting circuit for driving one of the word lines in the selected row with the program voltage, wherein the word line driven with the program voltage belongs to the other region of the column regions. The determining device includes a detecting circuit for detecting a column region where the data loaded on the register in response to a column address to select the column regions and generate selection signals as a result of the detecting and a switching circuit for selectively transmitting the program voltage to the first and second selection circuits in response to the selection signals.

In other embodiments, a flash memory device includes an array divided into a first memory block and a second memory block, a first row decoder circuit for selecting one of word lines in the first memory block and driving the selected word line with a program voltage and the non-selected word lines with a pass voltage, a second row decoder circuit for selecting one of the word line in the second memory block and driving the selected word line with the program voltage and the non-selected word lines with the pass voltage, a page buffer circuit for latching data to be programmed to the array, a gate circuit for transmitting the data to be programmed to the page buffer circuit in response to a column address, a determining circuit for judging to which memory block the data loaded on the page buffer circuit is programmed in response to the column address for selecting the first and second memory blocks and generating selection signals as a result of judging, a driving signal generator circuit for outputting driving signals to be provided to word lines each corresponding to the first and second memory blocks, and a switching circuit for switching the driving signals with all or one of the first and second decoder circuits in response to the selection signals from the determining circuit. In this case, the first and second memory blocks each include a plurality of NAND strings, and each of the NAND strings includes memory cells connected to corresponding word lines respectively. In addition, one of the driving signals has the program voltage and the rest of the driving signals have the pass voltage during a program operation.

In some embodiments, the determining circuit includes first and second flip-flops, a first set circuit, a first high voltage switch, a second set circuit and a second high voltage switch. The first and second flip-flops each reset by a reset signal. The first set circuit sets the first flip-flop in response to an address signal for identifying the first memory block during the program operation. The first high voltage switch receives an output signal of the first flip-flop to generate a first selection signal. In this case, the first selection signal has a high voltage during activation. The second set circuit sets the second flip-flop in response to an address signal for indicating the second memory block during the program operation. The second high voltage switch receives an output signal of the second flip-flop to generate a second selection signal. In this case, the second selection signal has a high voltage during activation.

The reset signal is activated when an input command of a sequential data is introduced. The switching circuit operates in response to the first and second selection signals and includes switches each corresponding to the driving signals. Each of the switches includes a first depletion MOS transistor for transmitting a corresponding driving signal to the first row decoder circuit in response to the first selection signal, and a second depletion MOS transistor for transmitting a corresponding driving signal to the second row decoder circuit in response to the second selection signal.

In further embodiments of the present invention, the array further includes a spare array. The spare array is divided into spare memory blocks each corresponding to the first and second memory blocks, and each the spare memory blocks is disposed with corresponding memory blocks. The memory block and the spare memory block disposed in the same region are controlled by an identical row decoder circuit.

DETAILED DESCRIPTION OF THE PREFERRED EMBODIMENT

The present invention will be described more fully hereinafter with reference to the accompanying drawings, in which exemplary embodiments of the invention are shown.

Figure 1:
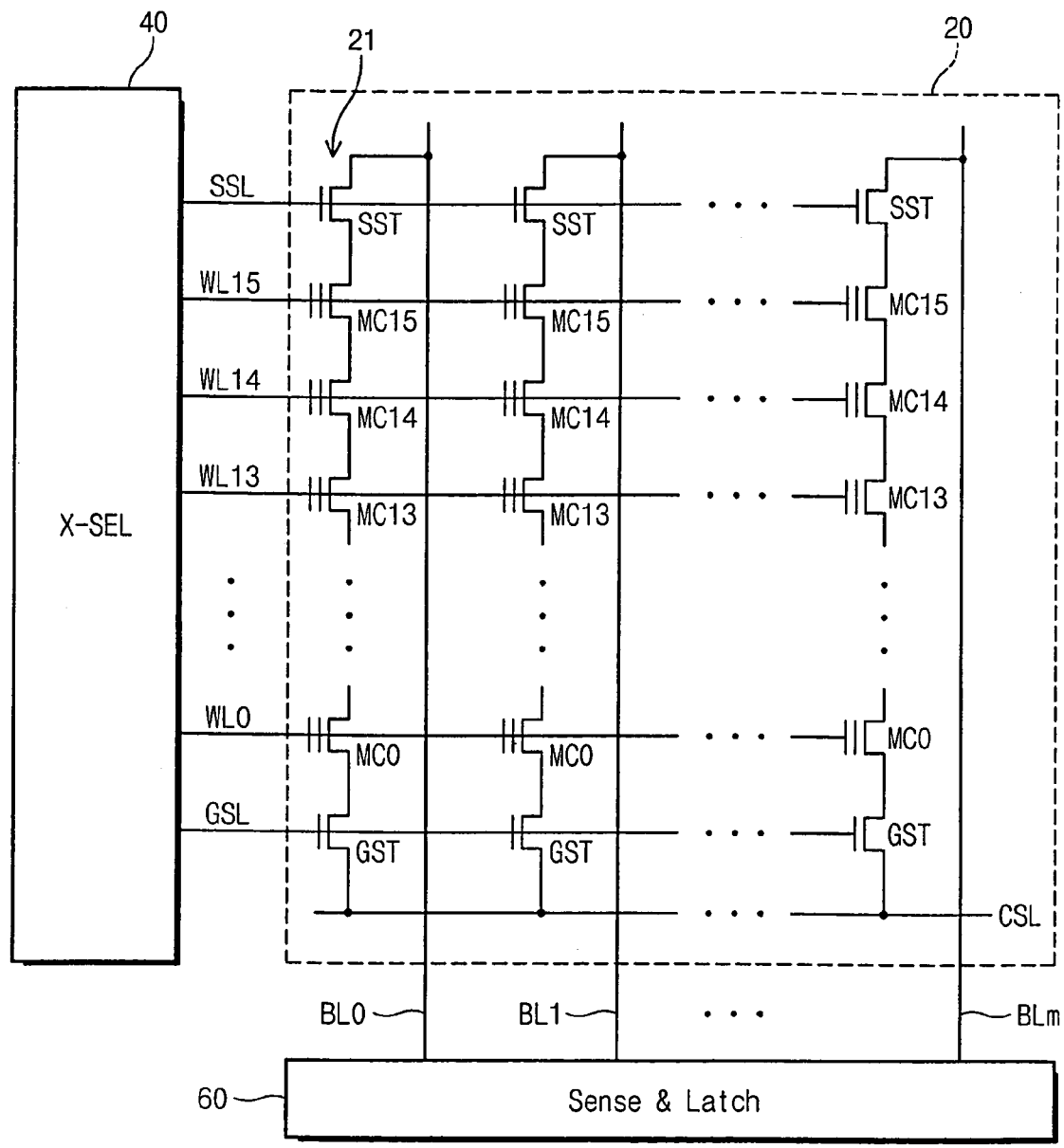
FIG. 1 is a block diagram illustrating a conventional NAND type flash memory device.
Figure 3:
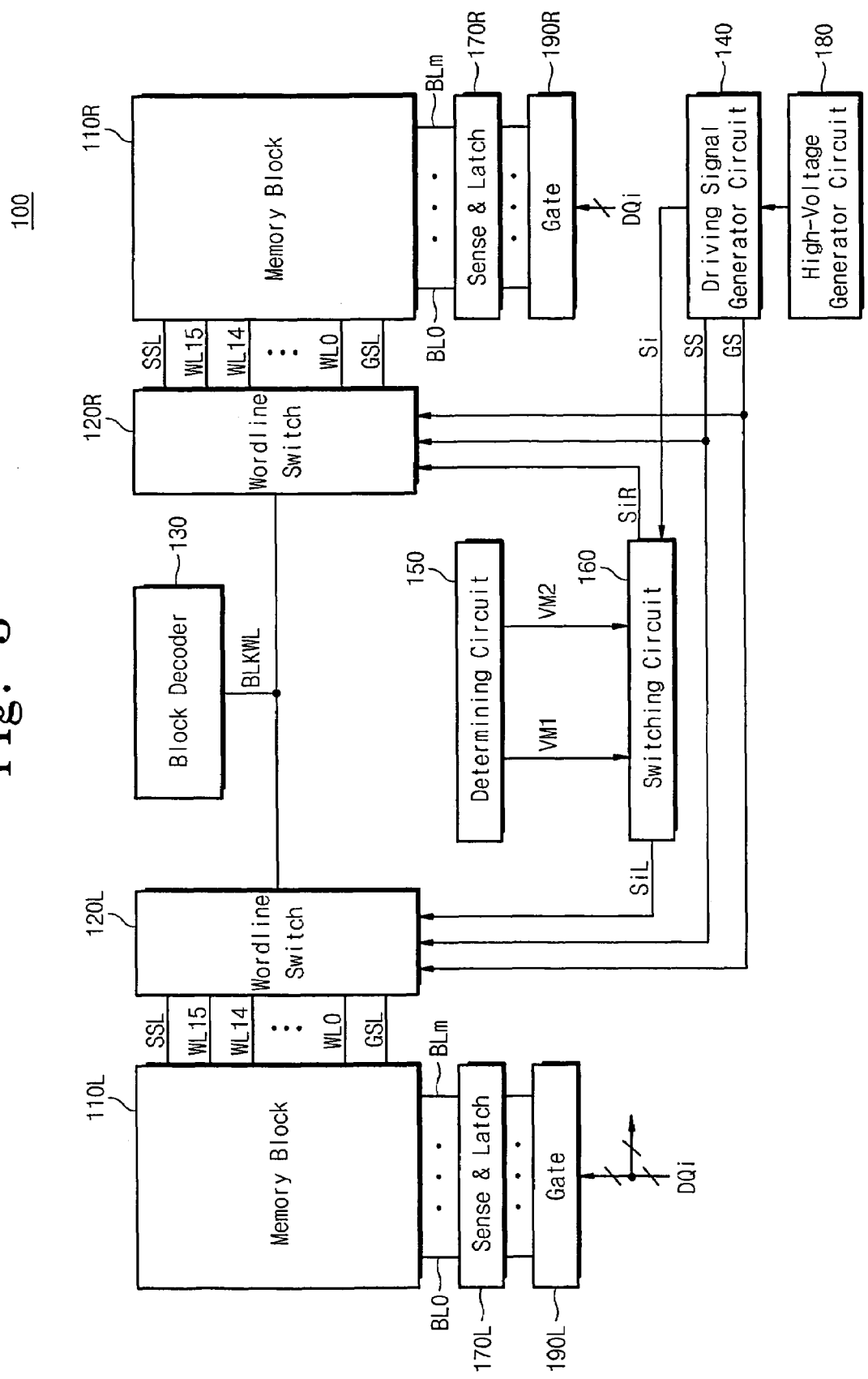
FIG. 3 is a block diagram illustrating a NAND type flash memory device according to one embodiment of the present invention.

FIG. 3 is a block diagram illustrating a NAND type flash memory device according to one embodiment of the present invention. Referring to FIG. 3, the NAND type flash memory device 100 includes arrays of memory cells arranged along rows and columns. According to the present invention, columns in the array are divided into two column regions and each row is divided into electrically isolated word lines that are disposed in the column regions, respectively. For brevity, one column region is referred to as a first memory block 110R composing a first mat (or a first memory cell array), and another column region is a second memory block 110L composing a second mat (or a second memory cell array). The first and second memory blocks 110R and 110L each include a plurality of cell strings, and each of the cell strings is organized in the same way as illustrated in FIG. 1. A row selection circuit is disposed between the first and second memory blocks 110R and 110L, and the row selection circuit comprises first and second word line switch blocks 120R and 120L and a block decoder 130. The row selection circuit may be shared by the memory blocks 110R and 110L.

Figure 4:
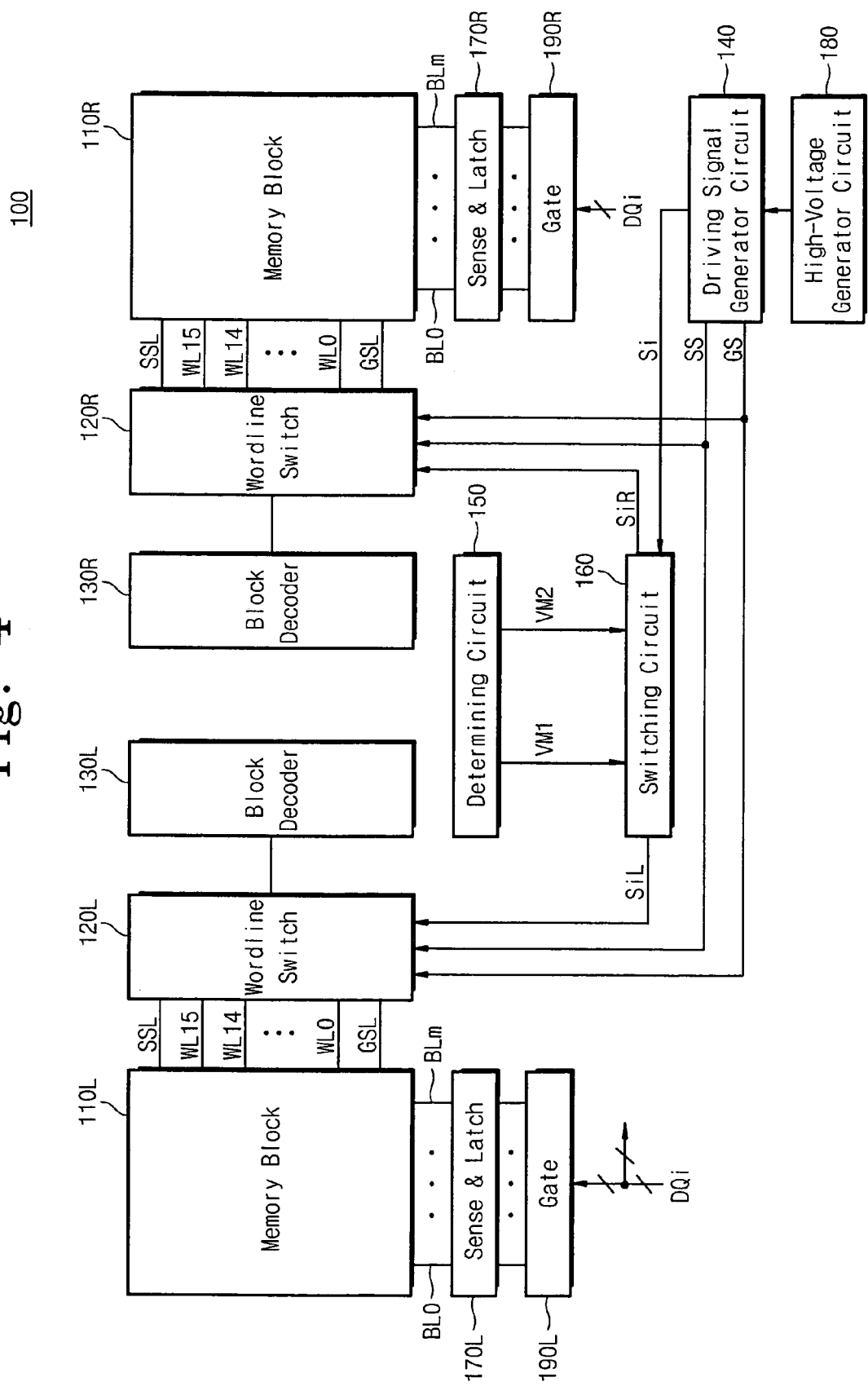
FIG. 4 is a block diagram illustrating a NAND type flash memory device according to another embodiment of the present invention.

Alternatively, as illustrated in FIG. 4, the row selection circuit may comprise two row decoder circuits 120R, 130R and 120L, 130L each corresponding to the first and second memory blocks 110R and 110L. Each of the decoder circuits may include a block decoder 130R/130L and a word line switch block 120R/120L. Although not illustrated in the drawings, it is clear that spare field memory region may be further included in each of the memory blocks 110R and 110L in addition to a main field memory region (with reference to FIG. 2).

Referring to FIG. 3 again, a string selection line SSL, word lines WL15–WL0 and the ground selection line GSL, which are disposed in a row direction of the first memory block 110R, are electrically connected to the first word line switch block 120R. According to signals on a block word line BLKWL, the first word line switch block 120R transmits the driving signals SiR (i=0–15) from a switching circuit 160 and driving signals SS and GS from a driving signal generator circuit 140 to corresponding signal lines SSL, WL0–WL15 and GSL, respectively. A string selection line SSL, word lines WL15–WL0 and a ground selection line GSL, which are disposed in a row direction of the second memory block 110L are electrically connected to a second word line switch block 120L. According to signals on the block word line BLKWL, the second word line switch block 120L transmits driving signals SiL (i=0–15) from the switching circuit 160 and the driving signals SS and GS from the driving signal generator circuit 140 to the corresponding signal lines SSL, WL0–WL15 and GSL, respectively. The block decoder 130 activates or inactivates the block word line BLKWL according to row address information for indicating a memory block.

The driving signal generator circuit 140 outputs the driving signals SS, S0–S15 and GS in response to the row address information for selecting one of the word lines disposed in each memory block. During a read operation, the selection signals SS and GS each have a power supply voltage VCC, one of the driving signals S0–S15 has the ground voltage, and the remaining driving signals have a reading voltage. During a program operation, the selection signal SS has the power supply voltage, and the selection signal GS has the ground voltage. In this case, one of the driving signals S0–S15 has a program voltage, and the rest have a pass voltage. The driving signal generator circuit 140 is provided with a program voltage, a pass voltage and a read voltage from a high voltage generator circuit 180 as determined by the different operation modes to apply a high voltage to each of the driving signal Si (i=1–15) lines.

Referring to the embodiments of both FIG. 3 and FIG. 4, bit lines BL0–BLm arranged along each column direction of the first and second memory blocks 110R and 110L are electrically connected to the corresponding sense and latch circuits 170R and 170L. Each of the sense and latch circuits 170R and 170L senses data from the flash EEPROM cells of the word line selected through bit lines BL0–BLm in a read operation mode. Each of the sense and latch circuits 170R and 170L latches the data to be programmed that is transferred through the gate circuit 190R or 190L in a program operation mode, and provides the power supply voltage or the ground voltage to the bit lines BL0–BLm according to the latched data. The switching circuit 160 receives the driving signals S0–S15 from the driving signal generator circuit 140, and outputs first driving signals S0R–S15R and/or second driving signals S0L–S15L in response to selection signals VM1 and VM2 from the determining circuit 150. Output signals of the switching circuit 160 have the same voltages as the voltages of the input signals. The determining circuit 150 outputs the selection signals VM1 and VM2 in response to the column address information for indicating a memory block. In this case, the selection signals VM1 and VM2 are activated exclusively or simultaneously. For instance, the selection signals VM1 and VM2 are simultaneously activated during a read/erase operation and simultaneously or exclusively activated during a program operation. This operation will be more fully explained herein.

Figure 5:
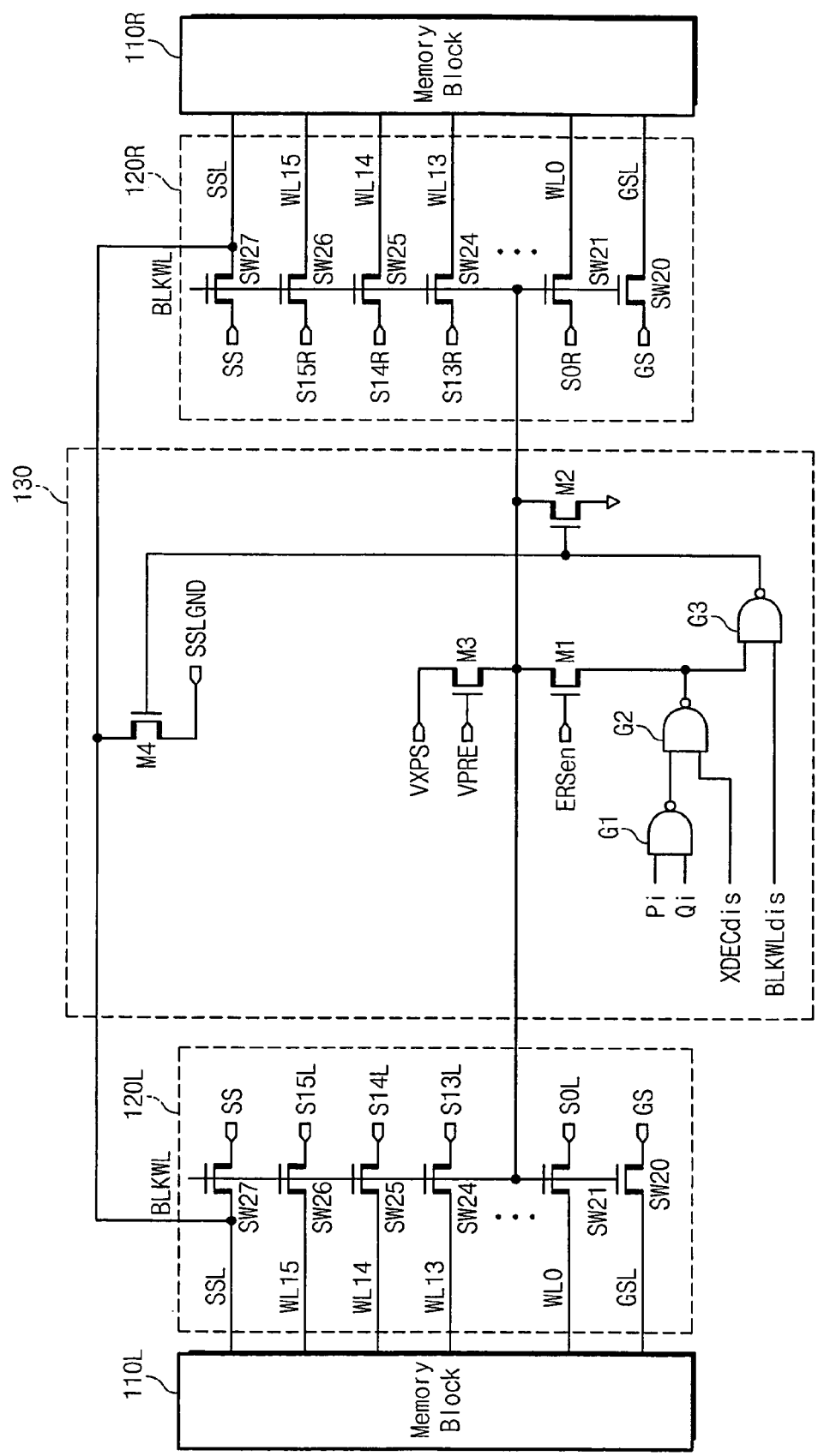
FIG. 5 is a circuit diagram illustrating a block decoder and a word line switch block of FIG. 3 according to one embodiment of the present invention.

FIG. 5 illustrates embodiments of the block decoder and the word line switch block shown in FIG. 3. The first word line switch block 120R includes pass transistors SW27–SW20 each corresponding to the driving signals SS, S15R–S0R and GS. Gates of the pass transistors SW27–SW20 are connected to a block word line BLKWL in common. The driving signals SS, S15R–S0R and GS are transferred to a string selection line SSL, word lines WL15–WL0 and a ground selection line GSL through pass transistors SW27–SW20, respectively. When a read operation is performed, one of the driving signals S15R–S0R has a ground voltage and the rest have a read voltage. When a program operation is performed, one of the driving signals S15R–S0R has a program voltage and the rest have a pass voltage. The pass transistors SW20–SW27 in the first word line switch block 120R each comprises a high voltage NMOS transistor.

A second word line switch block 120L is comprised of pass transistors SW27–SW20 each corresponding to the driving signals SS, S15L–S0L and GS. Gates of the pass transistors SW27–SW20 are connected to a block word line BLKWL in common. The driving signals SS, S15L–S0L and GS are transferred to the string selection line SSL, the word lines WL15–WL0 and the ground selection line GSL through the pass transistors SW27–SW20, respectively. When a read operation is performed, one of the driving signals S15L–S0L has a ground voltage and the rest have a read voltage. When a program operation is performed, one of the driving signals S15L–S0L has a program voltage and the rest have a pass voltage. The pass transistors SW20–SW27 in the second word line switch block 120L each comprises a high voltage NMOS transistor.

Still referring to FIG. 5, the block decoder 130 includes NAND gates G1, G2 and G3 and NMOS transistors M1, M2, M3 and M4, connected as illustrated in the drawing. The NMOS transistors M2 and M4 are controlled by an output signal of the NAND gate G3, and the NMOS transistors M1 and M3 are controlled by control signals ERSen and VPRE, respectively. The control signal ERSen has a low level during a program/read operation and a high level during an erase operation. The NMOS transistor M2 is used for discharging a block word line BLKWL, and turned on when a control signal BLKWL is in a low level. The output of NMOS transistor M4 is shared by memory blocks 110R and 110L, and is connected between string selection lines SSL of the memory blocks and an SSLGND node. The SSLGND node has a ground voltage during a program/read operation, and a power supply voltage during an erase operation. The control signals XDECdis and BLKWLdis are maintained at a high level for an interval while the data is programmed in a memory cell.

Figure 6:
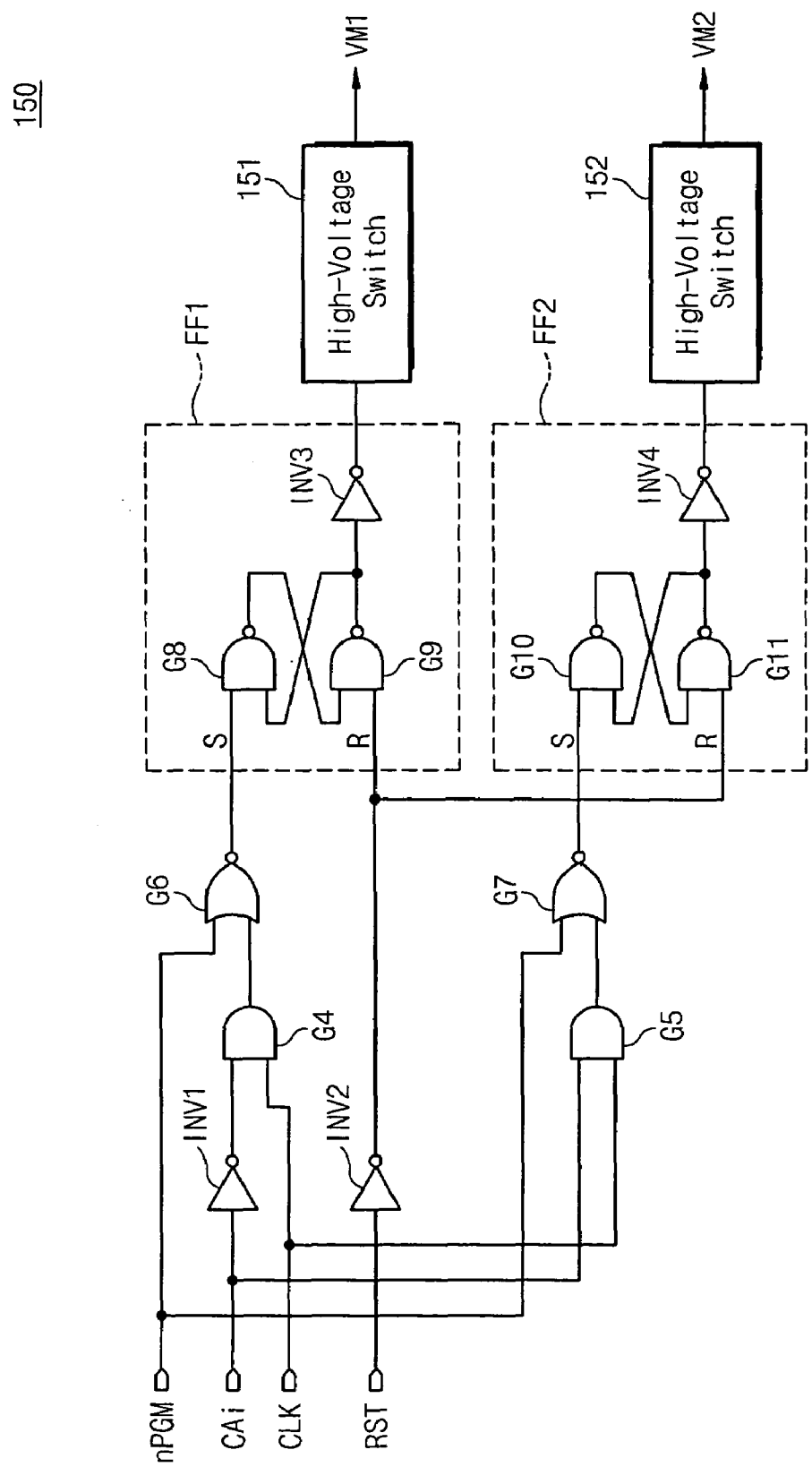
FIG. 6 is a circuit diagram illustrating a determining circuit of FIG. 3 according to one embodiment of the present invention.

FIG. 6 is a circuit diagram illustrating the determining circuit 150 of FIG. 3 according to an embodiment of the present invention. Referring to FIG. 6, the determining circuit 150 of the present invention includes inverters INV1 and INV2, AND gates G4 and G5, NOR gates G6 and G7, S–R flip-flops FF1 and FF2 and high voltage switches 151 and 152, each connected as illustrated in the drawing. The high voltage switches 151 and 152 each comprise a switch pump circuit, such as the switch pump circuit disclosed in the U.S. Pat. No. 5,861,772 entitled "CHARGE PUMP CIRCUIT OF NONVOLATILE SEMICONDUCTOR MEMORY". As widely known, each of the high voltage switches 151 and 152 converts a voltage level of input signal to a high voltage (e.g., a program voltage).

The determining circuit 150 receives a program flag signal nPGM, an address signal CAi, a reset signal RST and a clock signal CLK. The determining circuit 150 judges which sense and latch block 170L or 170R the data to be programmed is loaded on, and activates selection signals VM1 and VM2 simultaneously or exclusively according to the judging. In FIG. 5, the program flag signals nPGM is activated to a low level during a program operation and inactivated to a high level during an erase/read operation. The address signal CAi is for selecting memory blocks 110R and 110L. For example, when the address signal CAi is "0", the memory block 110R is selected. When the address signal CAi is "1", the memory block 110L is selected. A clock signal CLK is used for loading data to be programmed, and a reset signal RST is a pulse signal that is activated when a sequential data input command is introduced.

In a circuit operation, the reset signal RST is activated as an input command of a sequential data is introduced. In this case, a program flag signal nPGM is maintained at a low level. The outputs of the flip-flops FF1 and FF2 get a low level as the reset signal RST is activated. That is, the selection signals VM1 and VM2 are initialized as a low level, respectively. Afterwards, the data to be programmed are sequentially loaded on the sense and latch block(s) as the column address is incremented. In case that the column address signal CAi is maintained as "0" for a data loading interval, an output signal S of the NOR gate G6 transitions from a high level to a low level in synchronization with a low-high transition of the clock signal CLK. That is, the output of the flip-flop FF1 is activated from a low level to a high level. In this case, the output of the flip-flop FF2 is maintained at a low level, continuously. When the address signal CAi is maintained as "0" continuously until all of the data is loaded, the data to be programmed is loaded only on the sense and latch block 170R. In this case, only the selection signal VM1 is activated to high. If the address signal CAi changes to "1" while the data is being loaded, the output signal S of the NOR gate G7 transitions from a high level to a low level in synchronization with a low-high transition of the clock signal CLK. That is, outputs of the flip-flop FF2 are activated from a low level to a high level. In this case, the selection signals VM1 and VM2 are all activated to high. The activated selection signals VM1 and VM2 have high voltage through corresponding high voltage switches 151 and 152.

The determining circuit 150 activates a selection signal VM1 when the data to be programmed is loaded only on the sense and latch block 170R of the memory block 110R. The determining circuit 150 activates a selection signal VM2 when the data to be programmed is loaded only on the sense and latch block 170L of the memory block 110L. The determining circuit 150 activates the selection signals VM1 and VM2 when the data to be programmed is loaded on all of the sense and latch blocks 170R and 170L of the memory blocks 110R and 110L.

Figure 7:
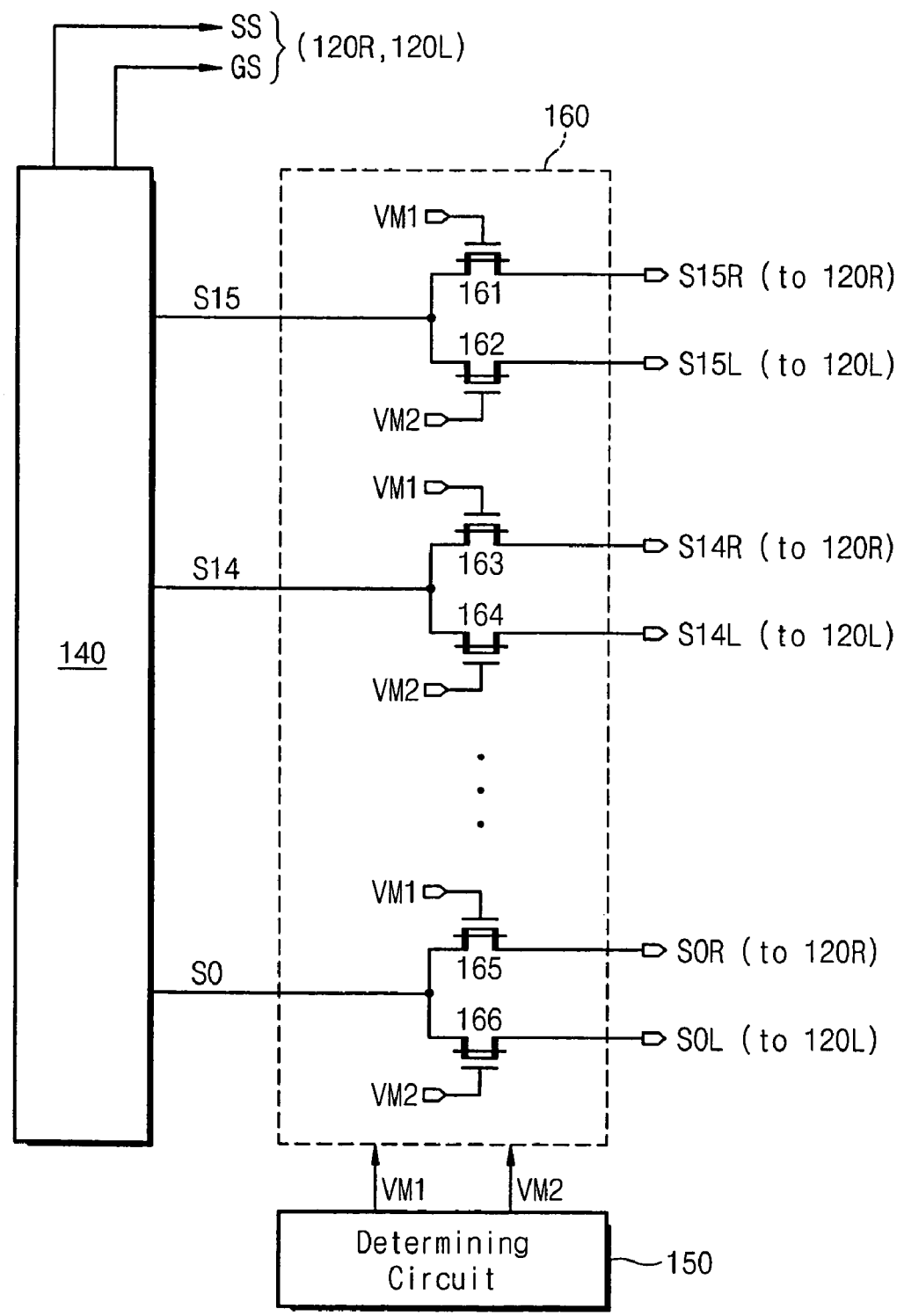
FIG. 7 is a circuit diagram illustrating a switching circuit of FIG. 3 according to one embodiment of the present invention.

FIG. 7 is a circuit diagram showing a switching circuit 160 of FIG. 3 according to an embodiment of the present invention. Referring to FIG. 7, The switching circuit 160 receives driving signals S0–S15 outputted from the driving signal generator circuit 140, and generates first driving signals S0R–S15R or second driving signals S0L–S15L in response to selection signals VM1 and VM2 from the determining circuit 150. The switching circuit 160 comprises depletion type MOS pass transistors 161, 162, 163, . . . and 166. The depletion type MOS transistors 161, 163, . . . and 165 correspond to the driving signals S0–S15, respectively, and the transistors are controlled by the selection signal VM1 in common. The depletion type MOS transistors 162, 164, . . . and 166 correspond to the driving signals S0–S15, respectively, and the transistors are controlled by the selection signal VM2 in common.

If the data to be programmed is loaded only on the sense and latch block 170R of the first memory block 110R, the determining circuit 150 activates a selection signal VM1, and the output signals S0–S15 of the driving signal generator circuit 140 generated as selection signals S0R–S15R are applied to the switch block 120R. When the data to be programmed is loaded only on the sense and latch block 170L of the second memory block 110L, the determining circuit 150 activates the selection signal VM2, and output signals S0–S15 of the driving signal generator circuit 140 generated as driving signals S0L–S15L are applied to the switch block 120L. If the data to be programmed is loaded on all of the sense and latch blocks 170R and 170L of the first and second blocks 110R and 110L, the determining circuit 150 activates the selection signals VM1 and VM2 simultaneously, and the output signals S0–S15 of the driving signal generator circuit 140 are outputted as first and second driving signals S0R–S15R and S0L–S15L that are applied to first and second switch blocks 120R and 120L.

Figure 8:
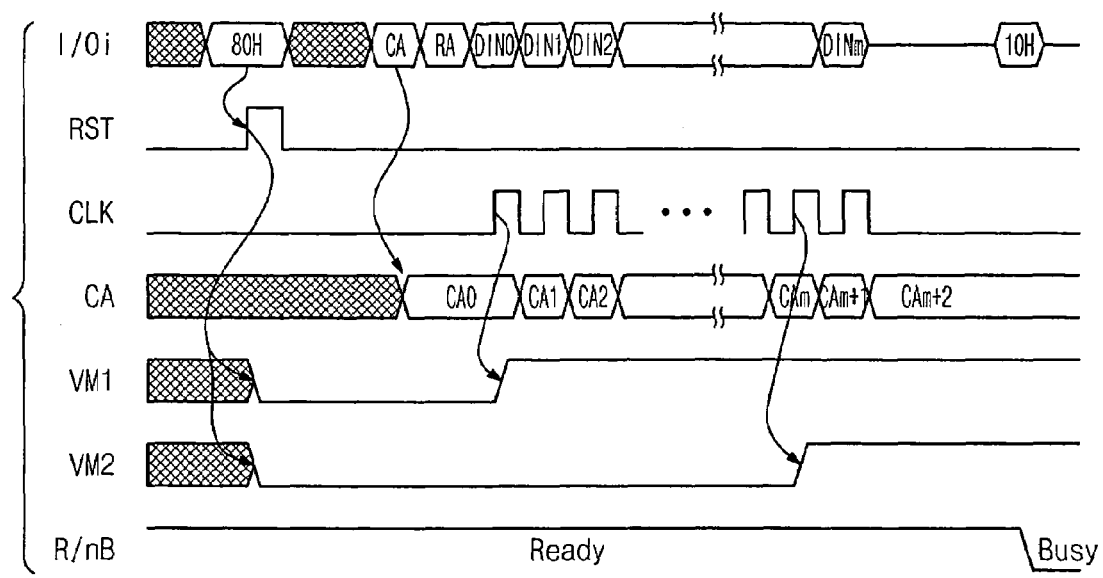
FIG. 8 is a timing diagram illustrating a partial program operation of the NAND type flash memory device according to the present invention.

FIG. 8 is a timing diagram for illustrating a program operation of a NAND type flash memory device. The program operation of the memory device according to the present invention will be fully explained herein with reference to the drawings. The signals shown in the first six lines of FIG. 8 are also identified in the circuit of FIG. 6.

As widely known, according to a program procedure of the NAND type flash memory device, a sequential data input command is introduced and an initial column address and a row (or a page) address are sequentially inputted. The initial column address is loaded on an internal address counter (not shown), and the internal address counter increases internal column addresses by one bit whenever data is inputted by a predetermined unit (a byte or a word unit). The data to be programmed is loaded on the sense and latch block(s) 170L or 170R as a page buffer circuit through a gate circuit as the column addresses increase. When all of the data is loaded, a program command for starting a program is inputted. The NAND type flash memory device 100 performs program operation according an internal algorithm known in the art after the program command is inputted, and notifies that the memory device is in a busy state to outside through a R/nB pin during the program operation.

When the sequential program data command is inputted, the reset signal RST is activated to a pulse type. When the reset signal RST transitions from a low level to a high level, flip-flops FF1 and FF2 of the determining circuits 150 are initialized. As the flip-flops FF1 and FF2 are initialized (referring to FIG. 8), the output signals VM1 and VM2 of the determining circuit 150 are set to a low level. Then, a starting (or initial) column address CAi where the data is going to be loaded is inputted, and the initial address counter (not shown) is set to an initial column address. Assume a column address for selecting memory blocks of the initial column addresses (e.g., an uppermost address signal) as "0". According to this assumption, the data to be programmed will be loaded on the sense and latch block 170R of the memory block 110R.

After a column address is inputted, the data to be programmed is loaded on the sense and latch block 170R through a column gate circuit 190R in synchronization with a clock signal CLK. Since the column address for selecting memory blocks is "0", an output signal of the NOR gate G6 in the determining circuit 150 transitions from a high level to a low level during a low-high transition of the clock signal. This makes the selection signal VM1 transition from a low level to a high level. In this case, the activated selection signal VM1 has a high voltage through a high voltage switch 151.

If the column address is maintained as "0" continuously until all of the data to be programmed is loaded, only the selection signal VM1 will be activated. This transmits the driving signals S0–S15 inputted in the switching circuit 160 only to a word line switch block 120R. When the data loading is ended and a program command is introduced, a program voltage and a pass voltage will be applied to the word lines of the memory block 110R. Conversely, since the selection signal VM2 is not activated, a program voltage and a pass voltage are not applied to word lines of the memory block 110L. That is, in case of a partial program, the program voltage and the pass voltage are applied only to the word lines of a memory block corresponding to the sense and latch block with a loaded data to be programmed. Therefore, a program disturbance can be prevented (or relieved) according to a partial program scheme because the program voltage and the pass voltage are not applied to the word lines in the memory block corresponding to the sense and latch block without the loaded data to be programmed.

Meanwhile, if a value of the column address for selecting the memory blocks varies from "0" to "1" before all the data to be programmed is loaded, the data to be programmed is loaded on the sense and latch block 170L of the memory block 110L through a gate circuit 190L. As the column address varies from "0" to "1", the output signal of the NOR gate G7 in the determining circuit 150 transitions from a high level to a low level in synchronization with a clock signal CLK. This activates the selection signal VM2 to high. This activation transmits the driving signal S0–S15 inputted in the switching circuit 160 to a word line switch block 120L. When the data loading is ended and a program command is introduced, a program voltage and a pass voltage will be applied to the word lines of the memory blocks 110R and 110L through a switching circuit 160. Therefore, the data loaded on the sense and latch blocks 170R and 170L is programmed to the corresponding memory blocks 110R and 110L.

Figure 2:
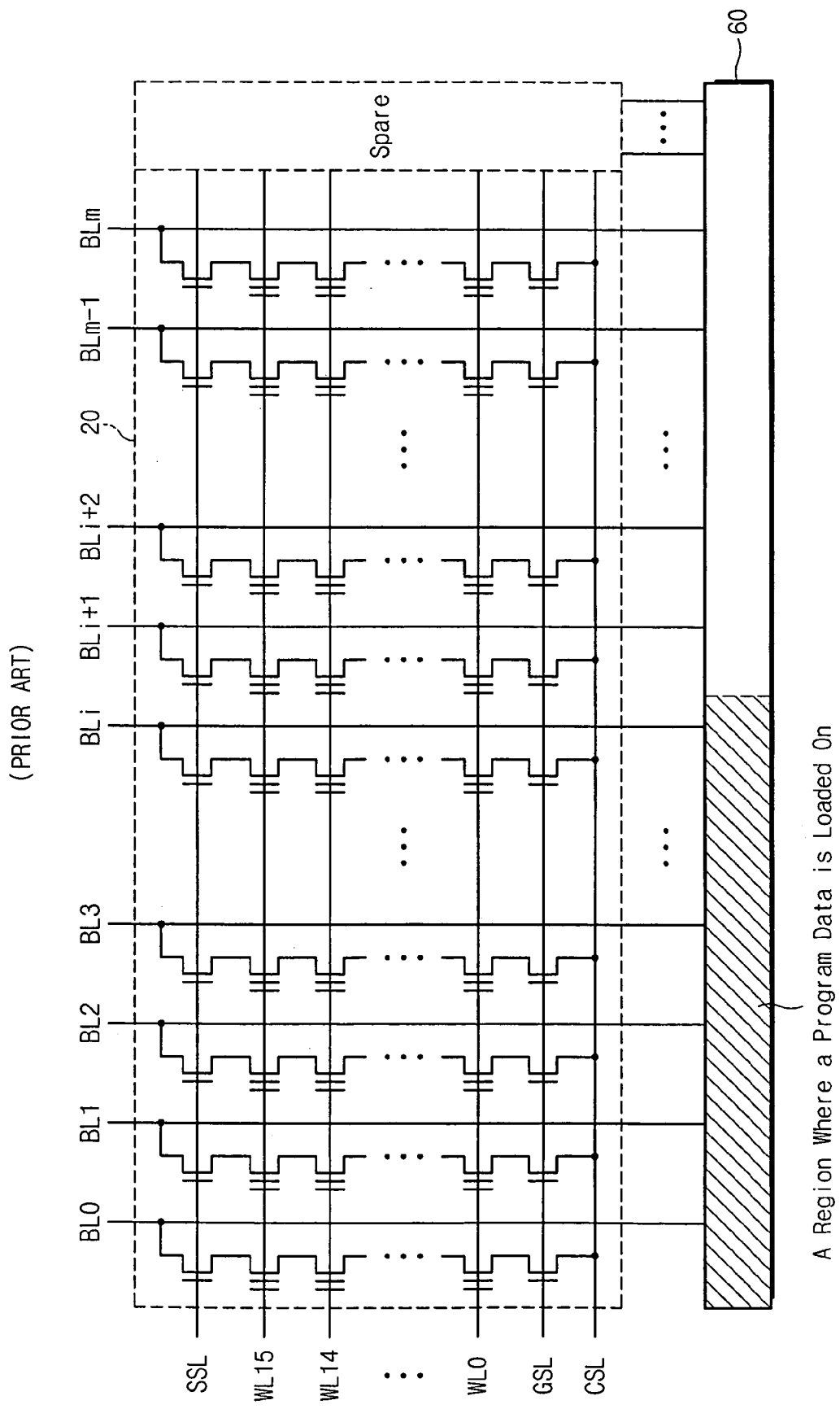
FIG. 2 illustrates a conventional method of partial programming.

Although not shown in the drawings, it is clear to those skilled in the art that the memory blocks of the present invention can include a corresponding spare field memory region. In the case that one row is divided into two word lines, the spare field memory region will also be divided into two regions. The divided spare field memory regions each correspond to the corresponding memory blocks. Thus, in case of the NAND flash memory device according to the present invention, the memory cell array may be organized as illustrated in FIG. 2. That is, the memory block 110R includes one of the divided spare field memory regions and the memory block 110L includes the other spare field memory region. In the same way as illustrated above, the word lines of the memory block and the corresponding spare field memory region are controlled by the identical row selection circuit.

According to the present invention, a program voltage and a pass voltage are not applied to word lines of a memory block corresponding to a sense and latch block without a loaded data to be programmed, such that a program voltage disturbance cannot be prevented (or relieved) according to a partial program scheme.

These embodiments were described on the bases of the structure in which one array is divided into only two memory blocks. However, it is well known to those skilled in the art that the present invention can be employed in the structures in which one array is divided into 4, 8 or more memory blocks.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A non volatile semiconductor memory device, comprising:
   arrays of memory cells arranged along rows and columns, wherein the columns are divided into at least two column regions;
   a register for latching data to be programmed in the array;

a gate circuit for transmitting data to be programmed to the register in response to column address information;

a determining device for judging which column region the data loaded on the register belongs to, during a program operation; and a selecting device for choosing one of the rows in response to row address information, and for driving one or word lines in the selected row to a program voltage according to a result of judging:

wherein each of the columns is divided into at least two electrically isolated word lines each arranged in the column regions.

2. The device of claim 1, wherein the determining device judges which column region the data loaded on the register belongs to according to the column address information.

3. The device of claim 1, wherein when all of the data loaded on the register belongs to one of the column regions, the selecting device drives the all of the word lines in the selected column with the program voltage.

4. The device of claim 1, wherein when the data loaded on the register belongs to any one of the column regions, the selecting device drives one of the word lines in the selected row with the program voltage, and the word line supplied with the program voltage corresponds to the column region with the loaded data.

5. The device of claim 1, wherein the selecting device drives all of the word lines in the selected row with a ground voltage regardless of the judging by the determining device during a read operation.

6. The device of claim 1, wherein the selecting drives all of the word lines in the selected row with a ground voltage regardless of the judging by the determining device during an erase operation.

7. The device of claim 1, wherein the selecting device comprises:

a first selecting circuit for driving one of the word lines in the selected row with the program voltage, wherein the word line driven with the program voltage belongs to one of the column regions; and a second selecting circuit for driving one of the word lines in the selected row with the program voltage, wherein the word line driven with the program voltage belongs to the other one of the column regions.

8. The device of claim 7, wherein the determining device, comprises:

a detecting circuit for detecting a column region which the data the register belongs to in response to a column address for selecting the column regions and generating selection signals as a result of detecting; and a switching circuit for selectively transmitting the program voltage to the first and second selecting circuits in response to the selection signals.

9. The device of claim 1, wherein a pass voltage is applied to word lines of non-selected rows in the column region including the word lines of the selected word lines provided with the program voltage.

10. A flash memory device, comprising:

an array divided into a first memory block and a second memory block;

at least two word lines coupled to each memory block;

a first row decoder circuit for selecting one of the word lines of the first memory block and driving the selected word line with a program voltage and the non-selected word lines with a pass voltage;

a second row decoder circuit for selecting one of the word lines the of second memory block and driving the selected word lines with a program voltage and the non-selected word lines with a pass voltage;

a page buffer circuit for latching data to be programmed to the array;

a gate circuit for transmitting the data to be programmed to the page buffer circuit in response to a column address;

a determining circuit for judging to which memory block the data loaded on the page buffer circuit is programmed in response to the column address selecting at least one of the first and second memory blocks and generating selection signals as a result of judging; and a driving signal generator circuit for outputting driving signals each to be provided for corresponding word lines of the first and second memory blocks; and a switching circuit for switching the driving signals with all or one of the first and second decoder circuits in response to the selection signals from the determining circuit;

wherein the first and second memory blocks each include a plurality of NAND strings, and each of the NAND strings includes memory cells connected to the corresponding word lines, respectively; and wherein the one of the driving signals has the program voltage and the rest driving signals have the pass voltage during a program operation.

11. The device of claim 10, wherein the determining circuit comprises:

a first flip-flop and a second flip-flop each reset by a reset signal;

a first set circuit for setting the first flip-flop in response to an address signal input for indicating the first memory block during the program operation;

a first high voltage switch for receiving an output signal of the first flip-flop to generate a first selection signal from the selection signals, wherein the first selection signal has a high voltage during an activation;

a second set circuit for setting the second flip-flop in response to an address signal for indicating the second memory block during the program operation; and a second high voltage switch for receiving an output signal of the second flip-flop to generate a second selection signal of the selection signals, so that the second selection signal has a high voltage during an activation.

12. The device of claim 11, wherein the reset signal is activated when an input command of a sequential data is introduced.

13. The device of claim 11, wherein the switching circuit includes switches operating in response to the first and second selection signals and each corresponding to the driving signals, and wherein each of the switches includes a first depletion MOS transistor for transmitting a corresponding driving signal to the first row decoder circuit in response to the first selection signal, and a second depletion MOS transistor for transmitting a corresponding driving signal to the second row decoder circuit in response to the second selection signal.

14. The device of claim 11, wherein the array further includes a spare field memory region, wherein the spare field memory region is divided into spare memory blocks each corresponding to the first and second memory blocks, and wherein each of the spare memory blocks is disposed with the corresponding memory block.

15. The device of claim 14, wherein the memory block and the spare memory block disposed in the same region are controlled by an identical row decoder circuit.

16. A flash memory device, comprising:
an array divided into a plurality of memory blocks;
at least two word lines coupled to each memory block;
a plurality of row decoder circuits each corresponding to the memory blocks and for selecting one of the word lines in the corresponding memory blocks and driving the selected word line with a program voltage and the non-selected word lines with a pass voltage;
a page buffer circuit for latching data being programmed in the array;
a gate circuit for transmitting the data to be programmed to the page buffer circuit in response to a column address;
a determining circuit for judging to which memory block the data loaded on the page buffer circuit is programmed in response to the column address selecting a least one of the memory blocks and generating selection signals as a result of the judging;
a driving signal generator circuit for generating at least two driving signals, each driving signal being provided to corresponding word lines of each of the memory blocks, respectively, wherein one of the driving signals has the program voltage and the rest of the driving signals have the pass voltage during a program operation; and
a switching circuit for selectively switching the driving signals to the row decoder circuits in response to the selection signals from the determining circuit, wherein one of more of the driving signals is transmitted to one or more row decoder circuits where the data loaded on the page buffer circuit is programmed,
wherein the memory blocks each include a plurality of NAND strings, and each of the NAND strings includes memory cells each connected to a corresponding word line.

17. The device of claim 16, wherein the array further includes a spare field memory region,
wherein the spare field memory region is divided into spare memory blocks each corresponding to one of the memory blocks, and
wherein each of the spare memory blocks is disposed with the corresponding memory block.

18. The device of claim 17, wherein the memory block and the spare memory block disposed in the same region are controlled by an identical row decoder circuit.

* * * * *